United States Patent
Lassure

(10) Patent No.: US 12,348,312 B2
(45) Date of Patent: Jul. 1, 2025

(54) WIRELESS TRANSMISSION AND RECEPTION OF PACKETIZED AUDIO DATA IN COMBINATION WITH FORWARD ERROR CORRECTION

(71) Applicant: Dolby International AB, Dublin (IE)

(72) Inventor: Gael Lassure, Fuerth (DE)

(73) Assignee: Dolby International AB, Dublin (IE)

( * ) Notice: Subject to any disclaimer, the term of this patent is extended or adjusted under 35 U.S.C. 154(b) by 0 days.

(21) Appl. No.: 18/563,333

(22) PCT Filed: May 30, 2022

(86) PCT No.: PCT/EP2022/064541
§ 371 (c)(1),
(2) Date: Nov. 21, 2023

(87) PCT Pub. No.: WO2022/253732
PCT Pub. Date: Dec. 8, 2022

(65) Prior Publication Data
US 2024/0297733 A1    Sep. 5, 2024

Related U.S. Application Data

(60) Provisional application No. 63/363,855, filed on Apr. 29, 2022, provisional application No. 63/195,781, filed on Jun. 2, 2021.

(51) Int. Cl.
*H04L 1/00* (2006.01)
*G06F 3/16* (2006.01)
(Continued)

(52) U.S. Cl.
CPC ............ *H04L 1/0057* (2013.01); *G06F 3/165* (2013.01); *H03M 13/1515* (2013.01); *H04L 1/0061* (2013.01); *H04L 1/08* (2013.01)

(58) Field of Classification Search
CPC ............... H03M 13/05; H03M 13/373; H03M 13/1515; H04L 1/08; H04L 1/0057;
(Continued)

(56) References Cited

U.S. PATENT DOCUMENTS 5,666,487 A    9/1997   Goodman
5,973,684 A   10/1999   Brooks
(Continued)

FOREIGN PATENT DOCUMENTS

EP    2454838 B1    7/2016
EP    2412160 B1    7/2020
(Continued)

OTHER PUBLICATIONS

Khalifeh A et al: "Optimal Audio Transmission Over Error-Prone Wireless Links",IEEE Transactions on Multimedia, IEEE, USA, vol. 12, No. 3, Apr. 1, 2010 (Apr. 1, 2010), pp. 204-214, XP011346675. 11 pages.
(Continued)

*Primary Examiner* — Shelly A Chase

(57) ABSTRACT

Methods for transmitting and receiving an audio stream are provided. For transmission, the method involves obtaining a frame of an audio signal, determining a number of source blocks to divide the frame of the audio signal into and a number of parity blocks to generate for forward error correction, wherein the number of source blocks and the number of parity blocks are determined based on characteristics of a wireless communication protocol to be used. The wireless communication protocol may be BLUETOOTH. The parity blocks are usable by a decoder to reconstruct one or more corrupted or missing source blocks and may be obtained by means of Reed-Solomon encoding.

20 Claims, 6 Drawing Sheets

(51) Int. Cl.
*H03M 13/15* (2006.01)
*H04L 1/08* (2006.01)

(58) Field of Classification Search
CPC ....... H04L 1/0061; H04L 1/0064; G06F 3/16; G06F 3/165
See application file for complete search history.

(56) References Cited

U.S. PATENT DOCUMENTS

| | | | |
|---|---|---|---|
| 6,367,049 | B1 | 4/2002 | Van Dijk |
| 6,532,563 | B2 | 3/2003 | Nobelen |
| 7,657,913 | B2 | 2/2010 | Pedlow, Jr. |
| 9,667,275 | B2 | 5/2017 | Hwang |
| 10,695,681 | B2 | 6/2020 | Irwin, Jr. |
| 10,965,726 | B2 | 3/2021 | Holden |
| 2005/0043959 | A1* | 2/2005 | Stemerdink ........... G10L 19/005 704/E19.048 |
| 2012/0260145 | A1 | 10/2012 | Yang |
| 2013/0097474 | A1* | 4/2013 | Hwang ............... H03M 13/618 714/776 |
| 2016/0148618 | A1* | 5/2016 | Huang ................ G10L 19/0212 381/2 |
| 2019/0007719 | A1 | 1/2019 | Gordon et al. |
| 2020/0106552 | A1 | 4/2020 | Paycher |

FOREIGN PATENT DOCUMENTS

| | | |
|---|---|---|
| JP | H08-316920 A | 11/1996 |
| JP | 2002330136 A | 11/2002 |
| JP | 2003520494 A | 7/2003 |
| JP | 2004172822 A | 6/2004 |
| JP | 2009260719 A | 11/2009 |
| JP | 2010034834 A | 2/2010 |
| JP | 2013074446 A | 4/2013 |
| JP | 2014233042 A | 12/2014 |
| JP | 2016119557 A | 6/2016 |
| JP | 2020502832 A | 1/2020 |
| JP | 2020504564 A | 2/2020 |

OTHER PUBLICATIONS

Luby M et al: "IPTV Systems, Standards and Architectures: Part II—Application Layer FEC in IPTV Services", IEEE Communications Magazine, IEEE Service Center, Piscataway, US, vol. 46, No. 5, May 1, 2008 (May 1, 2008), pp. 94-101, XP011226858. 8 pages.
Watson, M., Begen, A., et al, Forward Error Correction (FEC) Framework RFC 6363, 2011, 42 pages.
Zeadally S et al: "Design, implementation, and evaluation of the audio/video distribution transport protocol (AVDTP) for high quality audio support over Bluetooth", Computer Communications, Elsevier Science Publishers BV, Amsterdam, NL, vol. 28, No. 2, Feb. 10, 2005 (Feb. 10, 2005), pp. 215-223, XP027760556, 9 pages.

* cited by examiner

WIRELESS TRANSMISSION AND RECEPTION OF PACKETIZED AUDIO DATA IN COMBINATION WITH FORWARD ERROR CORRECTION

CROSS-REFERENCE TO RELATED APPLICATIONS

This application is the U.S. national stage entry of International Patent Application No. PCT/EP2022/064541, filed May 30, 2022, which claims priority of the following priority applications: U.S. provisional application 63/195,781 filed Jun. 2, 2021 and U.S. provisional application 63/363,855 filed Apr. 29, 2022, which are hereby incorporated by reference.

TECHNICAL FIELD

This disclosure pertains to systems, methods, and media for wireless audio stream transmission.

BACKGROUND

With the increasing use of networked home speaker devices, home theaters, and wireless speakers and headphones, users are increasingly using wireless communication channels for media content playback. Reliability of audio transport using wireless communication channels is important. With many wireless communication protocols, corrupted or dropped audio packets are re-transmitted by a transmitter device to a receiver device. However, re-transmission of corrupted or dropped audio packets may be detrimental. For example, re-transmission of packets may cause audio content to become de-synchronized with video content. As another example, re-transmission of packets may cause real-time audio content (e.g., phone or video conference conversations) to become distorted or have a delay. Accordingly, improved systems, methods, and media for wireless audio stream transmission are desired.

NOTATION AND NOMENCLATURE

Throughout this disclosure, including in the claims, the terms "speaker," "loudspeaker" and "audio reproduction transducer" are used synonymously to denote any sound-emitting transducer (or set of transducers). A typical set of headphones includes two speakers. A speaker may be implemented to include multiple transducers (e.g., a woofer and a tweeter), which may be driven by a single, common speaker feed or multiple speaker feeds. In some examples, the speaker feed(s) may undergo different processing in different circuitry branches coupled to the different transducers.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X-M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

SUMMARY

At least some aspects of the present disclosure may be implemented via methods. Some methods may involve obtaining a frame of an audio signal. Some methods may involve determining a number of source blocks to divide the frame of the audio signal into and a number of parity blocks to generate for forward error correction, wherein the number of source blocks and the number of parity blocks are determined based at least in part on characteristics of a wireless communication protocol to be used to transmit the audio stream. Some methods may involve dividing the frame of the audio signal into the number of source blocks. Some methods may involve generating the number of parity blocks using the source blocks. Some methods may involve transmitting the source blocks and the parity blocks, wherein the parity blocks are usable by a decoder to reconstruct one or more corrupted or missing source blocks.

In some examples, the parity blocks are generated using a Reed-Solomon encoder.

In some examples, the characteristics of the wireless communication protocol comprise timing information indicating packet scheduling of the wireless communication protocol. In some examples, the number of parity blocks is determined by: determining a total number of blocks to be used to encode the frame of the audio signal based on a duration of the frame of the audio signal and the timing information indicating packet scheduling: determining the number of source blocks; and determining the number of parity blocks by determining a difference between the total number of blocks and the number of source blocks.

In some examples, the characteristics of the wireless communication protocol comprise a frame size of the frame of the audio signal and/or a packet size of a packet to be used to transmit a source block of the source blocks or a parity block of the parity blocks. In some examples, the number of source blocks to be used is determined by determining a number of packets each having the packet size to transmit the frame having the frame size.

In some examples, the number of parity blocks identified for the frame of the audio signal differs from a number of parity blocks generated for a preceding frame of the audio signal.

In some examples, the number of parity blocks generated for frames of the audio signal varies in a repeatable manner that is determined based on timing information indicating packet scheduling of the wireless communication protocol.

In some examples, frames of the audio signal are not re-transmitted responsive to portions of the frames being dropped or corrupted.

In some examples, the wireless communication protocol is a BLUETOOTH protocol.

Some methods may involve receiving a set of source blocks and a set of parity blocks corresponding to a frame of an audio signal using a wireless communication protocol, wherein the set of source blocks are at least a subset of source blocks generated by an encoder and the set of parity blocks are at least a subset of parity blocks generated by the encoder, and wherein a number of source blocks and a number of parity blocks generated and transmitted by the encoder were determined based at least in part on characteristics of the wireless communication protocol. Some methods may involve determining a number of corrupted source blocks of the set of source blocks. Some methods may involve responsive to determining that the number of corrupted source blocks is greater than zero, determining whether to reconstruct the corrupted source blocks. Some methods may involve responsive to determining the corrupted source blocks are to be reconstructed, reconstructing the corrupted source blocks. Some methods may involve causing a version of the audio frame comprising the reconstructed corrupted source blocks to be presented.

In some examples, determining whether to reconstruct the corrupted source blocks comprises determining whether the number of corrupted source blocks is less than a number of non-corrupted parity blocks in the set of parity blocks received.

In some examples, some methods may further involve: receiving a second set of source blocks and a second set of parity blocks corresponding to a second frame of the audio signal; determining a second number of corrupted source blocks of the second set of source blocks; responsive to determining that the second number of corrupted source blocks of the second set of source blocks is greater than the number of parity blocks in the second set of parity blocks, generating a replacement audio frame; and causing the replacement audio frame to be presented. In some examples, the replacement audio frame comprises a reduction in output level of the audio signal.

In some examples, reconstructing the corrupted source blocks comprises providing the set of source blocks and the set of parity blocks to a Reed-Solomon decoder.

In some examples, some methods may further involve storing the set of source blocks and the set of parity blocks in a buffer prior to reconstructing the corrupted source blocks, and wherein an amount of audio data stored in the buffer varies over time based at least in part on packet scheduling associated with the wireless communication protocol.

In some examples, the wireless communication protocol is a BLUETOOTH protocol.

In some examples, the version of the audio frame comprising the reconstructed corrupted source blocks is presented via a loudspeaker.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented via one or more non-transitory media having software stored thereon.

At least some aspects of the present disclosure may be implemented via an apparatus. For example, one or more devices may be capable of performing, at least in part, the methods disclosed herein. In some implementations, an apparatus is, or includes, an audio processing system having an interface system and a control system. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION OF EMBODIMENTS

Figure 1:
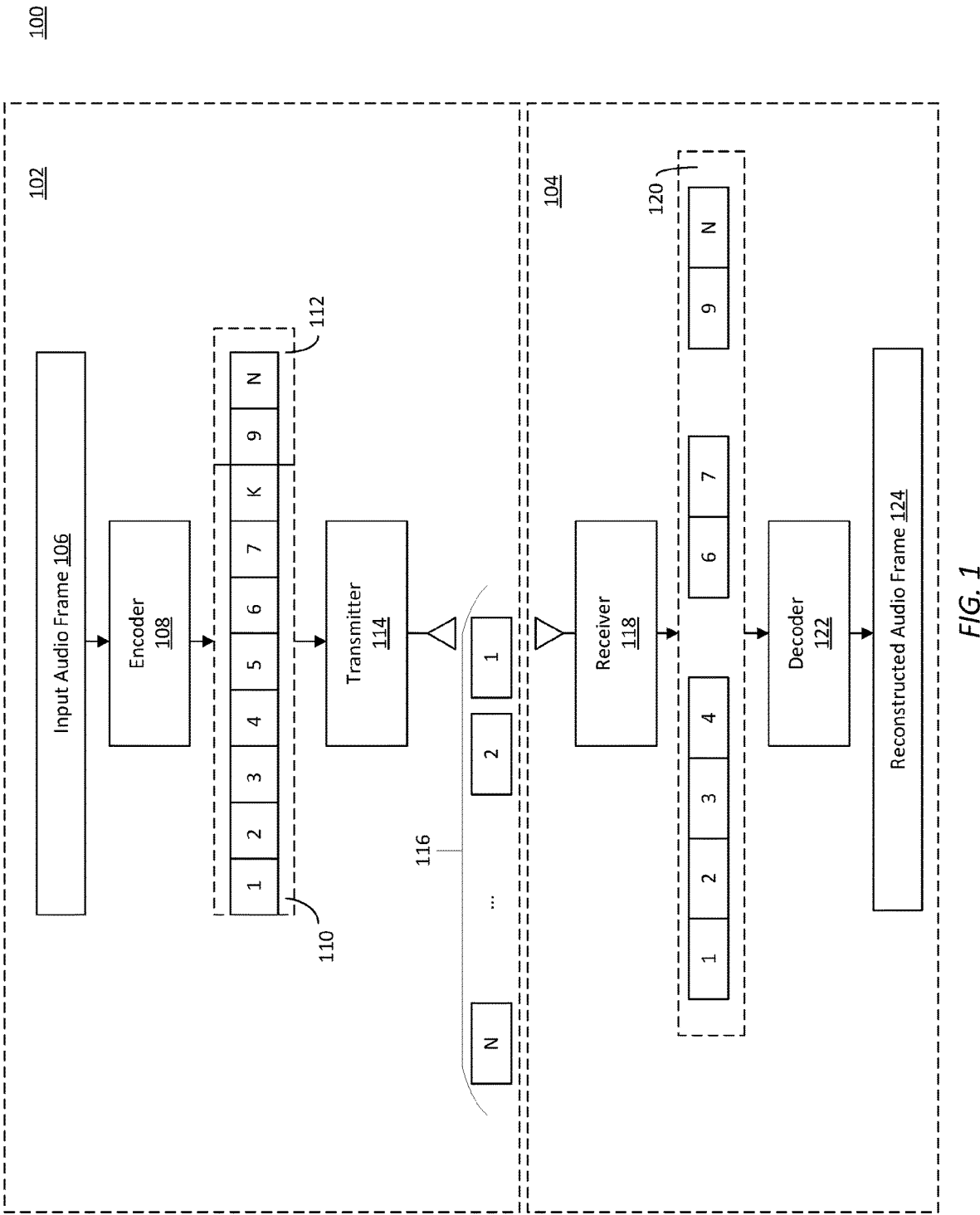
FIG. 1 is a schematic diagram of an example system for wireless audio stream transmission in accordance with some embodiments.

Reliability of audio stream transmission over wireless communication links, such as BLUETOOTH, WiFi, etc., may lead to dropped or corrupted packets. Generally, dropped or corrupted packets may lead to an entire frame of audio data being re-transmitted. Re-transmission of frames may lead to latency issues, for example, by causing audio playback to pause while waiting for frames to be re-transmitted. This may be particularly problematic during playback of audio content that includes real-time audio (e.g., telephone or teleconference conversations) and/or audio content that is synchronized with video content. Moreover, re-transmitting entire frames when only a portion of a frame may be corrupted or dropped (e.g., where a frame is split into multiple packets, and only a subset of the packets are dropped or corrupted) is an inefficient use of the wireless channel.

Described herein are systems, methods, and media for wireless audio stream transmission. The techniques described herein allow a wireless channel capacity to more efficiently be utilized. In particular, the techniques described herein utilize forward error correction to reconstruct portions of dropped or corrupted frames, thereby reducing the need to re-transmit dropped or corrupted frames. Moreover, the techniques described herein may decrease play back latency and reduce variance in latency, thereby reducing the number of pauses in audio content playback.

In some implementations, a transmitting device, which may include an encoder, may divide a frame of an audio signal into source blocks. The transmitting device may then generate a set of parity blocks from which corrupted or dropped source blocks may be reconstructed. In particular, each block may include a mathematically hashed version of the audio data for that block. The transmitting device may then transmit the source blocks and the parity blocks to a receiving device. The receiving device, which may include a decoder, may determine whether any of the source blocks have been dropped or corrupted, and, if so, may reconstruct the dropped or corrupted source blocks using the parity blocks.

In some embodiments, the number of source blocks and/or the number of parity blocks may be selected such that the channel capacity for wireless communication protocol is optimized. For example, the number of parity blocks may be selected to be the largest number of blocks that may be transmitted subject to the packet size and packet scheduling constraints specified by the wireless communication protocol, thereby maximizing the number of source blocks that may be reconstructed. More detailed techniques for determining the number of source blocks and/or the number of parity blocks are shown in and described below in connection with FIG. 2. Moreover, the total number of blocks that are generated and transmitted per frame may vary in a manner that optimizes the channel capacity by allowing additional parity blocks to be transmitted per frame, as shown in and described below in more detail in connection with FIGS. 2 and 3.

It should be noted that various forward error correction techniques or algorithms may be utilized in connection with the techniques described herein. Examples include Reed-Solomon encoding, Hamming encoding, binary convolution encoding, low-density parity check encoding, or the like. Forward error correction techniques are further described in Watson, M., Begen, A., and Roca, V. *Forward Error Correction (FEC) Framework* RFC 6363, 2011, which is hereby incorporated by reference herein in its entirety.

FIG. 1 shows an example of a system 100 for compressed audio transport in accordance with some embodiments. As illustrated, system 100 includes a transmitting device 102 that packetizes audio frames and transmits the packets, and a receiving device 104 that receives packets and reconstructs audio frames based on the received packets.

In some embodiments, an encoder 108 of transmitting device 102 may obtain an input audio frame 106. In some embodiments, input audio frame 106 may have any suitable duration (e.g., 10 milliseconds, 32 milliseconds, 40 milliseconds, or the like). In some embodiments, encoder 108 may obtain input audio frame 106 in any suitable manner, for example, by retrieving input audio frame 106 from a memory storing an audio stream, by identifying a next audio frame of the audio stream, or the like.

In some embodiments, encoder 108 may divide input audio frame 106 into a set of blocks. The set of blocks may include a set of source blocks 110. Note that a set of source blocks is generally represented as having K source blocks herein. The set of blocks may additionally include a set of parity blocks 112. Note that a set of parity blocks is generally represented as having P parity blocks herein. The set of blocks, as illustrated in FIG. 1, is generally represented as having N blocks, where N is represented by K+P (e.g., the number of source blocks plus the number of parity blocks). In some embodiments, the number of source blocks and the number of parity blocks may depend on characteristics of a wireless transmission protocol used by transmitting device 102 and receiving device 104, as shown in and described below in more detail in connection with FIG. 2.

In some embodiments, a transmitter 114 may transmit the set of source blocks 110 and the set of parity blocks 112. For example, transmitter 114 may utilize one or more antennas to wirelessly transmit data represented in set of source blocks 110 and set of parity blocks 112. In some embodiments, transmitter 114 may transmit the set of source blocks 110 and the set of parity blocks 112 as a sequence of packets 116, where each packet of sequence of packets 116 corresponds to a block of set of source blocks 110 or set of parity blocks 112. In some embodiments, transmitter 114 may transmit sequence of packets 116 in accordance with a scheduling protocol or scheduling constraints specified by or associated with the wireless communication protocol utilized by transmitter 114.

Turning to receiving device 104, a receiver 118 of receiving device 104 may receive a sequence of packets 120. For example, receiver 118 may utilize one or more antennas to wirelessly receive packets of the sequence of packets 116 that were transmitted by transmitter 114. As illustrated in FIG. 1, in some embodiments, the received sequence of packets 120 may include a subset of the packets transmitted by transmitter 114 of transmitting device 102. For example, in the example depicted in FIG. 2, two packets corresponding to two source blocks were dropped during transmission, and packets "5" and "K" are missing from received sequence of packets 120. It should be noted that received sequence of packets 120 is depicted merely as an example. In some instances, one or more packets may include corrupted blocks, or dropped packets may correspond to parity blocks. In other words, received sequence of packets 120 may differ from transmitted sequence of packets 116 is any suitable manner. Alternatively, in some instances, received sequence of packets 120 may perfectly correspond to transmitted sequence of packets 116, indicating full and uncorrupted transmission of input audio frame 106. In such instances, forward error correction utilizing the received parity blocks is not needed.

A decoder 122 of receiving device 104 may generate a reconstructed audio frame 124. For example, in some implementations, decoder 122 may utilize forward error correction techniques, such as Reed-Solomon encoding. Hamming encoding, or the like to reconstruct dropped and/or corrupted source blocks of received sequence of packets 120 using parity blocks included in sequence of packets 120, as shown in and described below in connection with FIG. 4.

In some implementations, reconstructed audio frame 124 may then be rendered and/or played back. For example, in some embodiments, reconstructed audio frame 124 may be rendered using various algorithms to distribute one or more audio signals across speakers and/or headphones to achieve a particular perceptual impression (e.g., that reflects spatial characteristics of the audio stream specified by the content creator, or the like). As another example, in some embodiments, reconstructed audio frame 124 may be played back, such as by causing reconstructed audio frame 124 to be presented via one or more loudspeakers, headphones, or the like. In some implementations, reconstructed audio frame 124 may be presented in a manner that is substantially synchronized with presentation of video content.

It should be noted that, in some implementations, packets corresponding to a compressed audio stream may be transmitted in a unicast network topology, where one transmitting device transmits packets that are received by one receiving device, or in a multicast network topology, where one transmitting device transmits packets to many receiving devices (e.g., two, three, five, ten, twenty, etc.).

In some embodiments, an encoder (e.g., of a transmitting device) may determine a number of source blocks and a number of parity blocks to be generated in connection with a frame of an audio signal. In some implementations, the number of source blocks and the number of parity blocks may be determined such that usage of a wireless communication protocol channel capacity is optimized. For example, the selected number of source blocks and number of parity blocks may allow an amount of corrupted or dropped source blocks to be reconstructed using the parity blocks such that few or no frames need be replaced with dummy frames or re-transmitted. In one example, the number of source blocks and the number of parity blocks may be selected such that up to 30% of source blocks for a given frame may be reconstructed. In some implementations, the number of source blocks and/or the number of parity blocks may be selected based on timing information associated with a wireless communication protocol used to transmit the audio stream. In some implementations, the timing information may include packet scheduling constraints associated with the wireless communication protocol. In some embodiments, the number of source blocks and/or the number of parity blocks may be determined based on a frame size of a frame of the audio signal and/or a packet size of a packet to be used to transmit a block. More detailed techniques for selecting the number of source blocks and/or the number of parity blocks in a manner that optimizes channel capacity are shown in and described below in connection with FIG. 2.

Figure 2:
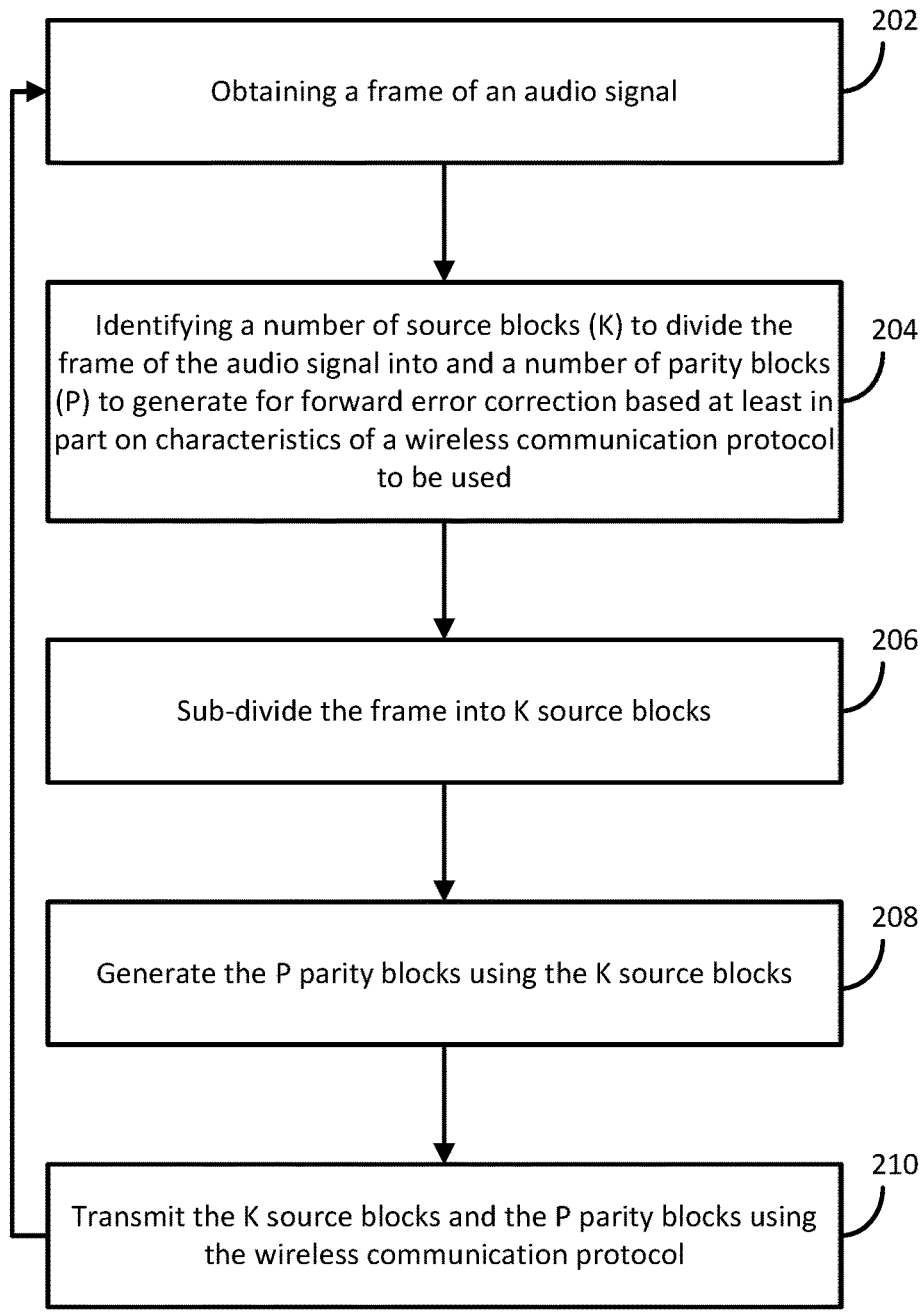
FIG. 2 is a flowchart of an example process for transmitting an audio stream in accordance with some embodiments.

FIG. 2 shows an example of a process 200 for transmitting a compressed audio stream in accordance with some embodiments. Blocks of process 200 may, in some examples, be performed by a control system, such as the control system 610 of FIG. 6. According to some examples, blocks of process 200 may be executed by a transmitting device, such as transmitting device 102 shown in FIG. 1. In some implementations, blocks of process 200 may be executed by an encoder and/or a transmitter of the transmitting device. In some embodiments, blocks of process 200 may be executed in an order other than what is shown in FIG. 2. In some implementations, two or more blocks of process 200 may be executed substantially in parallel. In some embodiments, one or more blocks of process 200 may be omitted.

Process 200 can begin at 202 by obtaining a frame of an audio signal. For example, in some implementations, process 200 may obtain the frame from a memory or other storage location. As another example, in some embodiments, process 200 may identify the frame as a next frame or a subsequent frame of the audio signal that is to be transmitted.

At 204, process 200 can identify a number of source blocks (generally represented herein as K) to divide the frame of the audio signal into, and a number of parity blocks (generally represented herein as P) to generate for forward error correction based at least in part on characteristics of a wireless communication protocol to be used.

In some implementations, the number of source blocks and/or the number of parity blocks may be determined based on timing information. In some embodiments, the timing information may include packet scheduling specifications or constraints associated with the wireless communication protocol. In some embodiments, a total number of blocks (e.g., source blocks plus parity blocks), N, may be determined based on the timing information. For example, in some embodiments, N may be determined as the number of blocks that can be transmitted given particular packet scheduling (e.g., a timing interval at which packets are transmitted by a transmitter) associated with the wireless communication protocol within a duration of the frame. By way of example, N may be determined by:

$$N = \frac{\text{frame\_duration}}{\text{packet\_interval}}$$

In the foregoing equation, "frame_duration" represents the time interval corresponding to a frame (e.g., in milliseconds, or in any other suitable unit), and "packet_interval" represents the timing interval at which packets are transmitted (e.g., the number of milliseconds between successively transmitted packets). In some implementations, a number of source blocks (e.g., K) may be determined based on a size (e.g., in bytes) of the frame of the audio signal and the size (e.g., in bytes) of a packet associated with the wireless communication scheme. For example, the number of source blocks may be determined as the number of blocks required to divide a frame having a particular frame size into a set of packets, each packet having the packet size. By way of example, K may be determined by:

$$K = \frac{\text{frame\_size}}{\text{packet\_size}}$$

In the foregoing equation, "frame_size" represents a size of the audio frame (e.g., in bytes, or in any other suitable unit), and "packet_size" represents the size of a packet to be transmitted (e.g., in bytes, or in any other suitable unit). In some implementations, a number of parity blocks (e.g., P) may be determined as a difference between the total number of blocks and the number of source blocks. By way of example, P may be determined by:

$$P = N - K$$

The following are examples for determining the total number of blocks, the number of source blocks, and the number of parity blocks for different audio stream bitrates and for different wireless communication protocols. In some embodiments, a wireless communication protocol may cause audio packets to be transmitted with a predetermined packet size and using a predetermined packet scheduling interval. In some implementations, the wireless communication protocol may be one that enables the transmission of non-compressed audio and whose effective bandwidth can also be used to reliably transport compressed audio. For example, in some implementations, packets may include compressed audio data, e.g., using 24-bit (or 16-bit, etc.) pulse coded modulation (PCM). The examples given below assume a frame duration of 32 milliseconds. However, this is merely an example, and the techniques described herein may be applied to frames having different durations. Moreover, the techniques described herein may be applied to various audio stream bitrates, wireless communication protocols utilizing other packet sizes and/or packet scheduling specifications, and/or other wireless communication protocols (e.g., WiFi) other than what is described in the below examples.

The following table indicates frame sizes (in bytes) that may be utilized for audio streams having various bitrates (in kbps). The frame size may be used to determine the number of source blocks.

| Bitrate (in kbps) | Frame size (bytes) |
| --- | --- |
| 128 | 512 |
| 384 | 1536 |
| 448 | 1792 |
| 768 | 3072 |
| 1355 | 5420 |
| 1664 | 6656 |

In a first example, a wireless communication link may transport audio packets, each having a packet size of, 288 bytes and a packet scheduling interval of 1 packet per 1 millisecond. In this example, the packets may be transmitted using a packet scheduling interval of 1 packet per 1 millisecond. Accordingly, for a frame size of 3072 bytes (corresponding to a 768 kbps bitrate), the total number of blocks N may be determined as the frame duration (32 milliseconds) divided by the packet interval (1 milliseconds). That is, in such a case, N may be 32 total blocks. Continuing with this first example, the number of source blocks K may be determined as the frame size (3072 bytes) divided by the packet size (288 bytes). That is, in such a case, K may be 10.67, or, rounding up, 11 source blocks. Correspondingly, the number of parity blocks P may be 32-11, or 19 parity blocks.

In a second example utilizing a packet size of 288 bytes and a packet scheduling interval of 1 packet per 1 millisecond, for a frame size of 5426 bytes (corresponding to a 1355 kbps bitrate), the total number of blocks N may be determined as the frame duration (32 milliseconds) divided by the packet interval (1 milliseconds). That is. N may be 32 total blocks. Continuing with this second example, the number of source blocks K may be determined as the frame size (5426 bytes) divided by the packet size (288 bytes). That is, in such a case, K may be 18.82, or, rounding up. 19 source blocks. It should be noted that, in some implementations, a partial portion of the last source block may be used to encode bytes of the next frame. In some such implementations, these extra bytes may be used to correct for any corruptions in the first source block of the next frame. Additionally or alternatively, in some implementations, a copy of the first bytes of a frame may be used. Correspondingly, the number of parity blocks P may be 32-19, or 11 parity blocks. In some implementations, such as in some instances in which the frame duration is an integer number of milliseconds, the total number of blocks used for a frame of the audio signal may be the same (e.g., 32 total blocks per frame), regardless of the bitrate and/or frame size. In other words, in some implementations, the total number of blocks used for a frame of the audio signal may be dependent on the packet scheduling interval, rather than bitrate and/or frame size. In other implementations, the total number of blocks per frame may vary based on bitrate and/or frame size.

In an example in which BLUETOOTH is used as the wireless communication protocol, a packet may have a size of up to 240 bytes (e.g., 200 bytes, 224 bytes, 230 bytes, 236 bytes, 240 bytes, or the like). BLUETOOTH packets may be transmitted using a packet scheduling interval that is a multiple of 1.25 milliseconds. For example, BLUETOOTH packets may be scheduled to be transmitted at 1.25 millisecond slots, at 2.5 millisecond slots, etc. In a first example, for a frame size of 1792 bytes (corresponding to a bitrate of 448 kbps), a packet size of 224 bytes, and for a packet scheduling interval of 2.5 milliseconds, the total number of blocks N may be determined as the frame duration (32 milliseconds) divided by the packet scheduling interval (2.5 milliseconds). That is, in such a case. N may be 12.8, or, rounding up. 13 total blocks. Continuing with this first example, the number of source blocks K may be determined as the frame size (1792 bytes) divided by the packet size (224 bytes). That is, in such a case, K may be 8 source blocks. Correspondingly, the number of parity blocks P may be 13-8, or 5 parity blocks.

It should be noted that, in some implementations, the number of parity blocks may effectively be dependent on the bitrate of the audio signal. For example, because the number of source blocks is proportional to the frame size, which is in turn proportional to the bitrate, for a fixed total number of blocks, the number of parity blocks may be inversely proportional to the bitrate. In other words, more parity blocks may be used for lower bitrate signals relative to higher bitrate signals. It should be noted that, in some implementations, bitrate may be adapted in order to balance tradeoffs between audio quality and implementations of forward error correction. By way of example, in some embodiments, a receiver device may transmit a message to a transmitter device that the quality of the received audio signal is degraded. Continuing with this example, the transmitter may select a lower bitrate for transmitting the audio signal, which may result in lower audio quality, but with additional headroom for transmitting parity blocks, which may be utilized by the receiver device for forward error correction.

Referring back to FIG. 2, at 206, process 200 may sub-divide the frame into K source blocks. The frame may be sub-divided by dividing data of the frame into K blocks such that the data of the frame is divided generally equally amongst the K source blocks.

At 208, process 200 may generate the P parity blocks using the K source blocks. For example, in some implementations, process 200 may use a particular forward error correction technique or algorithm to generate the P parity blocks using the K source blocks. Examples of forward error correction techniques that may be used include ReedSolomon encoding. Hamming encoding, or the like. In an example in which ReedSolomon encoding is used, and in which N=32. K=19, and P=11, a ReedSolomon scheme of (32, 19) may be used. Similarly, in an example in which ReedSolomon encoding is used, and in which N=13, K=8, and P=5, a ReedSolomon scheme of (13, 8) may be used. It should be understood that other forward error correction techniques, such as Hamming codes, binary convolution codes, low-density parity check codes, or the like may be used. In some implementations, the forward error correction technique used may be selected based on correction efficiency of the technique, and/or any other considerations.

At 210, process 200 may transmit the K source blocks and the P parity blocks using the wireless communication protocol. For example, in some implementations, the source blocks and the parity blocks may be transmitted as a sequence of packets, where each packet is transmitted according to a packet scheduling constraint associated with the wireless communication protocol. For example, for some communication protocols, the sequence of packets may be transmitted as one packet per millisecond. As another example, in an instance in which the wireless communication protocol is BLUETOOTH, the sequence of packets may be transmitted as one packet per 2.5 millisecond (or any other suitable multiple of 1.25 milliseconds).

It should be noted that, in some implementations, a header may be added to a packet. For example, a header may indicate the forward error correction scheme (e.g., utilized at block 208) to generate the parity blocks. As a more particular example, the header may indicate the type of algorithm used, the total number of blocks, the number of source blocks, and/or the number of parity blocks. As another example, in some embodiments, a header may include a checksum, such as a cyclic redundancy check (CRC), that may be utilized to determine whether or not the packet has been corrupted. As yet another example, in some embodiments, a header may include a sequence counter that may be utilized for detecting dropped packets.

Process 200 may then loop back to block 202 and obtain another frame of the audio signal. Process 200 may loop through blocks 202-210 until the entirety of the audio signal has been transmitted. Additionally or alternatively, in some implementations, process 200 may loop through blocks 202-210 until receiving an instruction to stop transmitting the audio signal (e.g., a signal received from a user device, from a remote control device, from a keyboard or other user input device, a spoken signal, a gesture associated with an instruction to stop transmitting the audio signal, or the like).

It should be noted that the transmission of parity blocks may increase an overall transmission bitrate associated with the audio stream. In one example, an audio stream that would be transmitted at 448 kbps without parity blocks may be transmitted with a bitrate of 653 kbps, due to the extra data associated with the parity blocks. However, usage of the parity blocks to reconstruct dropped or corrupted source blocks (using forward error correction) reduce or entirely eliminate re-transmitted frames, thereby improving an overall efficiency of the wireless channel.

In some implementations, a total number of blocks used to encode a frame may vary from frame to frame. In some embodiments, the number of parity blocks may vary from frame to frame based on the total number of blocks utilized. For example, while the total number of blocks utilized may vary, the number of source blocks may remain fixed from frame to frame. Accordingly, the number of parity blocks may vary from frame to frame, e.g., to account for the varying number of total blocks with a fixed number of source blocks. In some implementations, the variance from frame to frame may occur in a repeatable manner that is dependent on timing information (e.g., packet scheduling constraints) associated with a particular wireless communication protocol.

By way of example, in an instance in which BLUETOOTH is utilized as the wireless communication protocol, packets (each packet corresponding to a block) may be transmitted at a time interval of 2.5 milliseconds (or any other suitable multiple of 1.25 milliseconds). Accordingly, in an instance in which a frame is sub-divided into 9 source blocks, a first frame may be associated with 4 parity blocks, for a total of 13 blocks. Because the 13 blocks (corresponding to one frame of the audio signal) are transmitted in 32.5 milliseconds (e.g., 13×2.5 milliseconds), which is more than the 32 milliseconds duration of the frame, the transmitting device may be effectively be running behind the audio stream. Accordingly, after a predetermined number of frames, the total number of blocks may be reduced (e.g., reduced by one) to account for the extra time required to transmit to blocks for the preceding frames. By way of example, after four frames have been transmitted with 13 total blocks (e.g., 9 source blocks and 4 parity blocks), the fifth frame may be transmitted with 12 total blocks (e.g., 9 source blocks and 3 parity blocks). Note that, in this example, using a scheme of 13 blocks for the first four frames, and 12 blocks for the fifth frame, across the five frames, 64 total blocks may be transmitted (e.g., each as a packet) spanning 160) milliseconds (e.g., 64×2.5 milliseconds), which corresponds to the time duration spanned by the five frames (e.g., 32 milliseconds×5).

Figure 3:
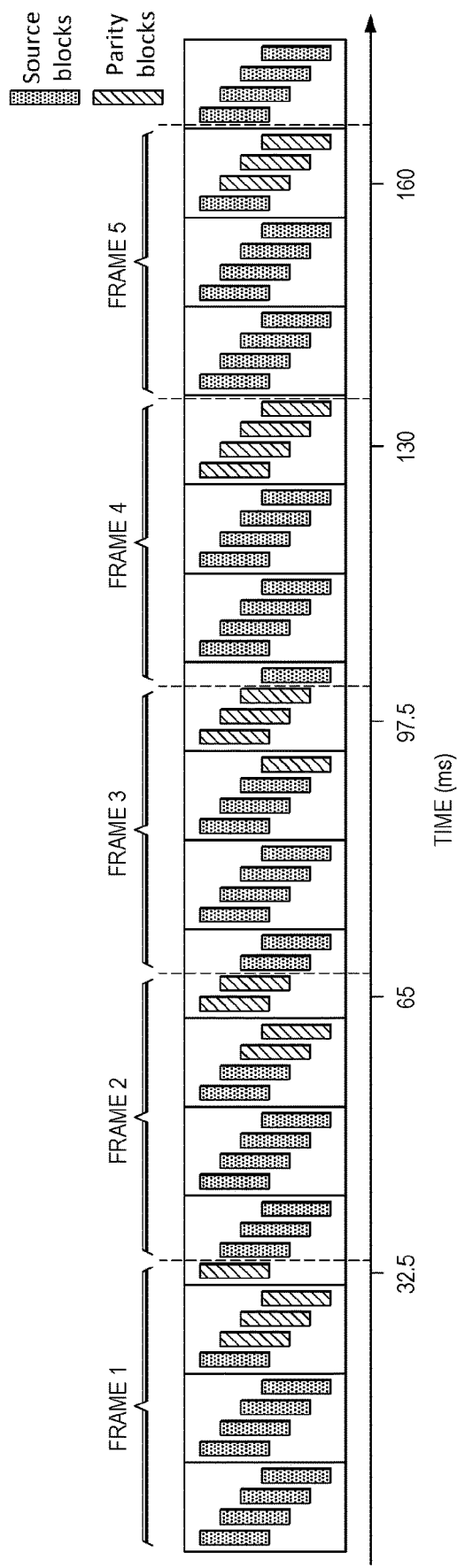
FIG. 3 is a schematic diagram of example packets for transmitting an audio stream in accordance with some embodiments.

FIG. 3 shows an example packet scheme in which the number of blocks utilized per frame varies on a frame by frame basis in accordance with some embodiments. As illustrated, for Frame 1, 9 source blocks and 4 parity blocks are transmitted. The blocks are grouped into groups of 4, where each block is transmitted in association with a packet, and where packets are transmitted at 2.5 millisecond intervals. Accordingly, 4 blocks (whether source or parity) are transmitted in 10 milliseconds. Similarly, Frames 2, 3, and 4 are associated with 9 source blocks and 4 parity blocks. However, due to the extra time required to transmit 13 blocks per frame, for Frame 5, 9 source blocks and 3 parity blocks (e.g., one fewer parity block) are transmitted, allowing the encoding scheme to re-align with the frames of the audio signal.

In some implementations, a receiving device (e.g., a BLUETOOTH or Wi-Fi connected speaker or headphones, or the like) may receive a sequence of packets, each packet corresponding to a transmitted block (e.g., a source block or a parity block). In some embodiments, a decoder of the receiving device may determine a number of corrupted or dropped blocks of a set of source blocks associated with the received sequence of packets. In some implementations, responsive to determining that at least one source block is corrupted or has been dropped in transmission, the decoder may determine whether the corrupted or dropped blocks can be reconstructed using the parity blocks. For example, the decoder may determine whether the number of corrupted blocks is less than the number of parity blocks. In some embodiments, responsive to determining that the corrupted blocks may be reconstructed, the decoder may reconstruct the corrupted blocks and cause an audio frame that includes the reconstructed source blocks to be presented. Conversely, responsive to determining that the corrupted blocks cannot be reconstructed, the decoder may generate a replacement, or "dummy" frame, and may cause the replacement or dummy frame to be presented.

Figure 4:
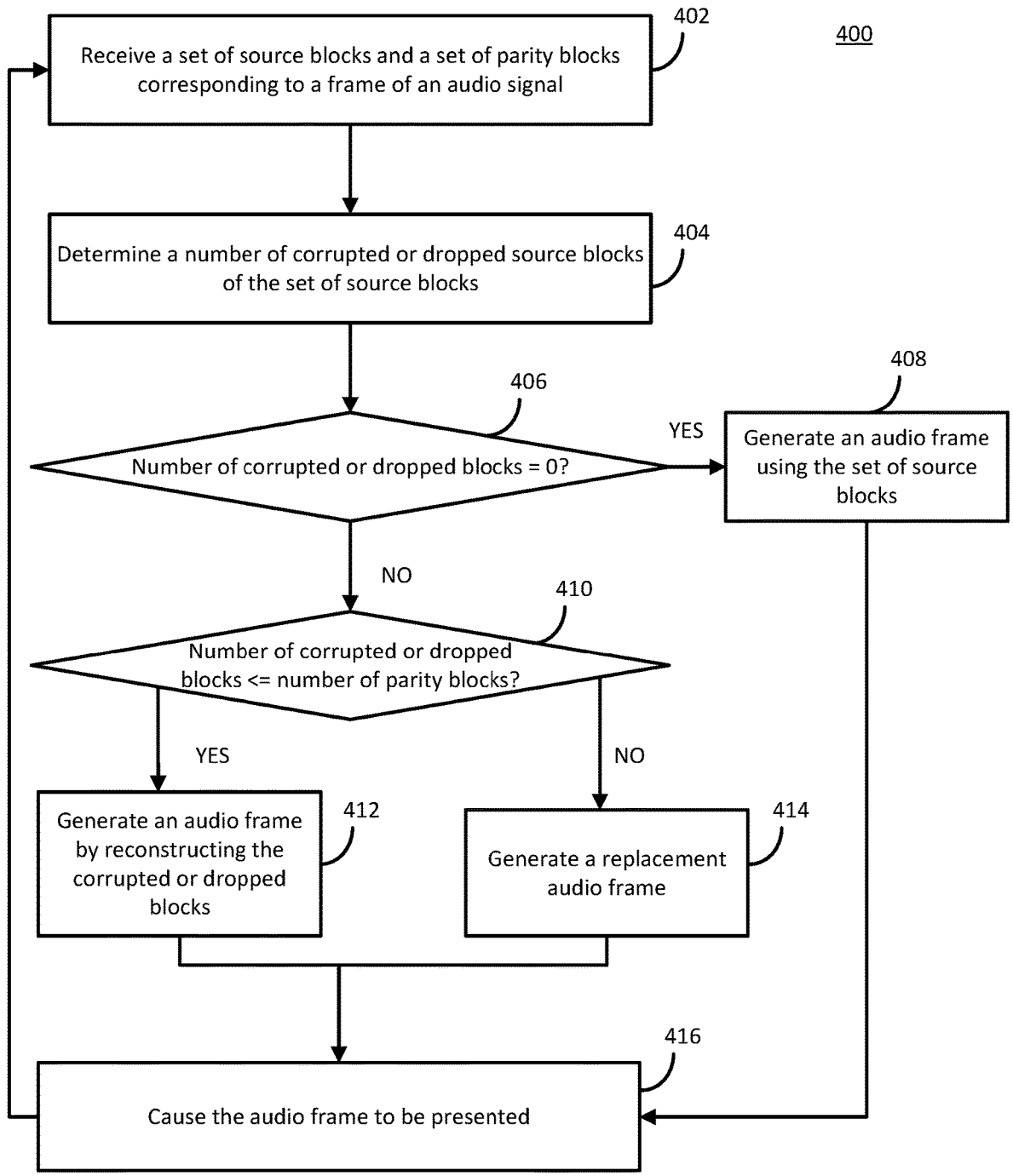
FIG. 4 is a flowchart of an example process for receiving and presenting an audio stream in accordance with some embodiments.

FIG. 4 shows an example of a process 400 for reconstructing source blocks and presenting audio signals in accordance with some embodiments. Blocks of process 400 may, in some examples, be performed by a control system, such as the control system 610 of FIG. 6. In some embodiments, blocks of process 400 may be executed on a receiving device, such as receiving device 104 of FIG. 1. In some embodiments, blocks of process 400 may be executed by a decoder and/or a receiver of the receiving device. In some implementations, blocks of process 400 may be executed in an order other than what is shown in FIG. 4. In some embodiments, two or more blocks of process 400 may be executed substantially in parallel. In some embodiments, one or more blocks of process 400 may be omitted.

Process 400 can begin at 402 by receiving a set of source blocks and a set of parity blocks corresponding to a frame of an audio signal. In some embodiments, each block may be associated with a received packet of a sequence of received packets. In some implementations, process 400 may obtain a block (e.g., a source block or a parity block) from the packet. In some implementations, process 400 may obtain the block using information stored in a header of the packet.

At 404, process 400 can determine a number of corrupted source blocks or dropped source blocks of the set of source blocks. In some implementations, process 400 may identify a source block of the set of source blocks as corrupted based at least in part on a checksum (e.g., a CRC value) included in a header of a packet corresponding to the source block.

Corrupted source blocks may be identified using any suitable forward error correction techniques, such as using ReedSolomon encoding, or the like. In some implementations, process 400 may identify a number of dropped source blocks by identifying a difference between an expected number of source blocks (e.g., as specified by the forward error correction scheme being used) and the received number of source blocks.

At 406, process 400 can determine if the number of corrupted or dropped source blocks is zero. If, at 406, process 400 determines that the number of corrupted or dropped source blocks is zero ("yes" at 406), process 400 can proceed to 408 and can generate an audio frame using the set of source blocks. For example, process 400 can reconstruct a full length audio frame using data included in the source blocks of the set of source blocks. Process 400 can then proceed to block 414 and can cause the audio frame to be presented (e.g., by one or more speakers, one or more headphones, etc.).

Conversely, if, at 406, process 400 determines that the number of corrupted or dropped blocks is not zero ("no" at 406), process 400 can proceed to block 410 and can determine whether the number of corrupted or dropped source blocks is less than or equal to the number of parity blocks. For example, in an instance in which the number of received parity blocks is three, process 400 may determine that the number of corrupted or dropped blocks is less than or equal to the number of parity blocks if the number of corrupted or dropped blocks is one, two, or three. It should be noted that, at 402, the number of received parity blocks may be less than the number of parity blocks transmitted by a transmitting device (e.g., in instances in which parity blocks are dropped). Accordingly, in some embodiments, process 400 may compare the number of corrupted or dropped source blocks to the number of received parity blocks (e.g., rather than to the number of expected, or transmitted, parity blocks). Additionally or alternatively, in some implementations, one or more of the received parity blocks may be corrupted. Accordingly, in some implementations, process 400 may compare the number of corrupted or dropped source blocks to the number of received parity blocks which are not corrupted (e.g., those parity blocks which may be utilized in forward error correction).

If, at 410, process 400 determines that the number of corrupted or dropped source blocks is less than or equal to the number of parity blocks ("yes" at 410), process 400 can proceed to 412 and can generate an audio frame by reconstructed the corrupted or dropped source blocks. For example, process 400 can use the forward error correction scheme to reconstruct corrupted or dropped source blocks using the received parity blocks. As described above, the forward error correction scheme (e.g., ReedSolomon encoding. Hamming encoding, etc.) used to generate the parity blocks may be similarly used to reconstruct corrupted or dropped source blocks. In some implementations, the forward error correction scheme to be used may be specified in one or more packet headers of packets corresponding to the received source blocks and the received parity blocks (e.g., as described above in connection with block 402).

Conversely, if, at 410, process 400 determines that the number of corrupted or dropped source blocks exceeds the number of parity blocks ("no" at 410), process 400 can proceed to 414 and can generate a replacement, or dummy, audio frame. In some embodiments, the replacement, or dummy, audio frame may be one that soft mutes an output of a decoder, e.g., by lowering overall sound levels during the duration of presentation of the audio frame. In some implementations, audio data from a preceding frame and/or a next frame may be utilized to generate the replacement frame. For example, in some implementations, interpolation may be used to generate data corresponding to a replacement frame. In one example, interpolation may be performed between audio data from the preceding frame and audio data of the next frame.

Regardless of whether block 412 or 414 is executed, at 416, process 400 can cause the audio frame to be presented. For example, process 400 can cause the audio frame (whether an audio frame that includes reconstructed corrupted or dropped source blocks, or a replacement/dummy audio frame) to be presented via one or more speakers, one or more headphones, etc. It should be noted that prior to causing an audio frame to be presented, in some embodiments, process 400 may render the audio frame. e.g., to distribute audio signals to one or more speakers, headphones, etc., to create particular perceptual impressions.

In some implementations, the above-described techniques may generate a number of source blocks and a number of parity blocks that is optimized for a channel capacity of a particular type of wireless link. More particularly, the number of source blocks and the number of parity blocks may be chosen (using the techniques described herein) such that relatively few frames need to be retransmitted or replaced with dummy frames due to not having enough parity blocks to reconstructed corrupted or dropped source blocks. Moreover, by determining the number of source blocks and the number of parity blocks based on packet scheduling constraints, the techniques described herein may allow a buffer associated with a decoder (e.g., of a receiving device) to generally maintain a non-zero amount of data or a non-zero duration of audio data thereby reducing overall system latency. For example, in an instance in which a total number of blocks associated with a frame (e.g., source blocks and parity blocks) are transmitted in a duration of time that exceeds the duration of the frame, there may be an initial latency at the decoder to receive all of the blocks corresponding to the frame. However, due to the initial latency, the decoder may then be able to maintain a buffer that generally remains about 0 milliseconds. This may allow the receiving device to continuously play an audio stream without pauses or breaks to allow the buffer to catch up, which may be particularly advantageous in instances in which real-time audio data is being presented and/or in instances in which audio content that is synchronized with video content is being presented.

Figure 5:
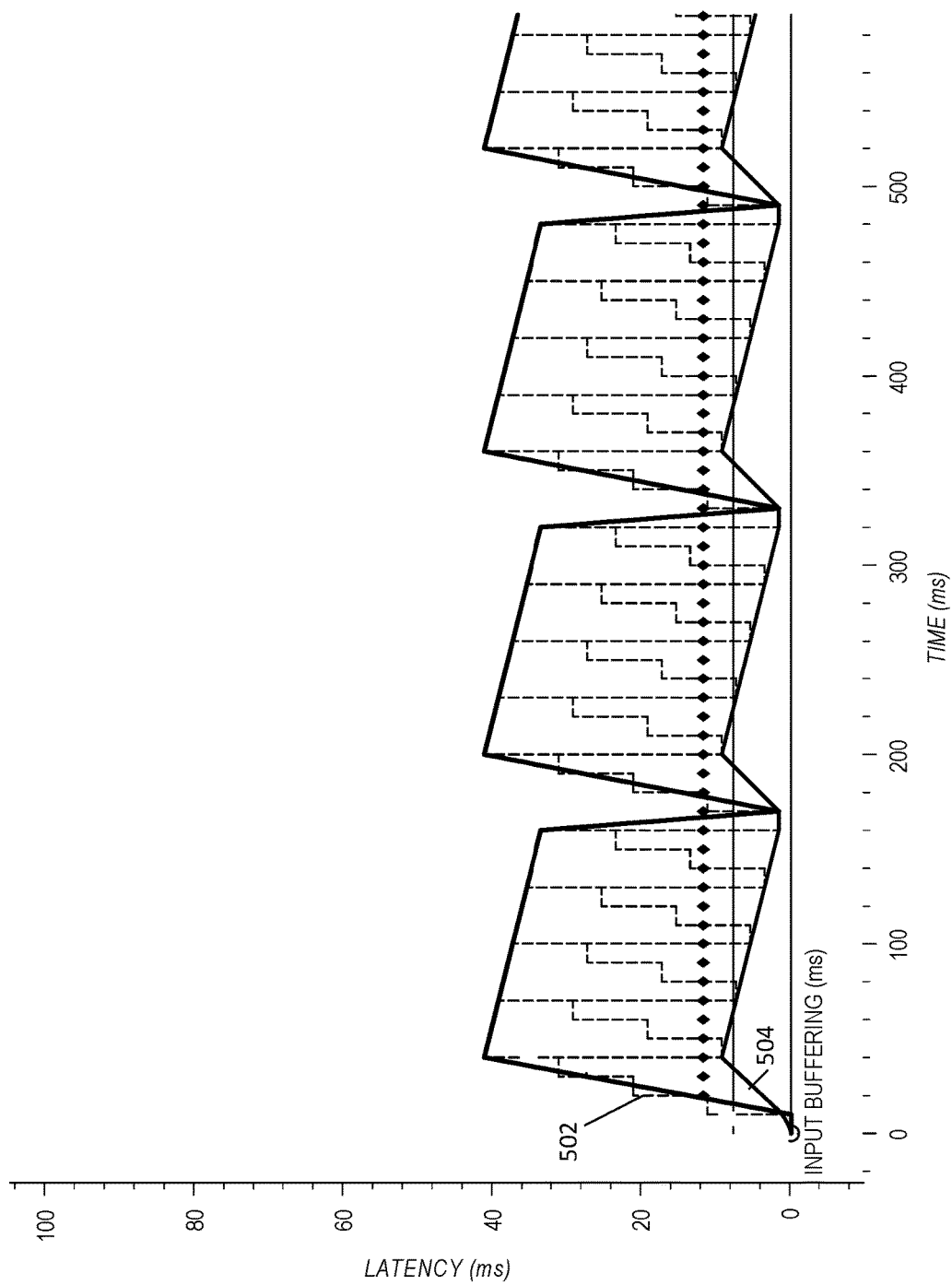
FIG. 5 is illustrates example data that shows latencies of a transported audio stream utilizing the techniques described herein in accordance with some embodiments.

FIG. 5 shows an example of buffer latency utilizing the source and parity block scheme shown in and described above in connection with FIG. 3. FIG. 3 described an example source and parity block scheme relevant to BLUETOOTH communication, in which packets (each corresponding to a block) are transmitted at 2.5 millisecond intervals, and in which 4 blocks are transmitted per 10 millisecond isochronous interval. In the example shown in and described above in FIG. 3, for the first four frames. 9 source blocks and 4 parity blocks are transmitted, and for the fifth frame. 9 source blocks and 3 parity frames are transmitted.

Referring to FIG. 5, curve 502 shows the duration of audio data stored in a buffer of a decoder in milliseconds. Each stepwise increase in curve 502 corresponds to blocks received in a 10 millisecond isochronous interval (e.g., in which 4 blocks are received at 2.5 millisecond packet spacing intervals). Because, for the first four frames, 13 blocks are utilized, the decoder receives all of the audio data for a frame (having a duration of 32 milliseconds) in 40 milliseconds (e.g., in four isochronous intervals). In other words, the 13th block is received during the fourth isochronous interval, spanning 30-40 milliseconds, and, accordingly, the decoder is then ready to present the first audio frame after 40 milliseconds. Accordingly, as shown in FIG. 5 by curve 502, after 40 milliseconds have elapsed, the duration of audio data stored in the buffer drops from 40 milliseconds to 8 milliseconds, because one frame worth of audio data (e.g., 32 milliseconds) is presented. Curve 504 illustrates a duration of un-played audio data stored in the buffer. As illustrated, due to the mismatch between a duration of time required to receive a 32 millisecond frame of audio data relative to the duration of the audio frame, the buffer always has at least partial data for a next frame. Moreover, due to the forward error correction (e.g., the parity blocks), the data in the buffer may generally correspond to usable source blocks (e.g., usable as is and/or may be reconstructed using the parity blocks), thereby allowing more robust audio playback. This may allow the decoder to allow continuous or near-continuous audio playback without requiring pauses to allow time to buffer additional data.

Figure 6:
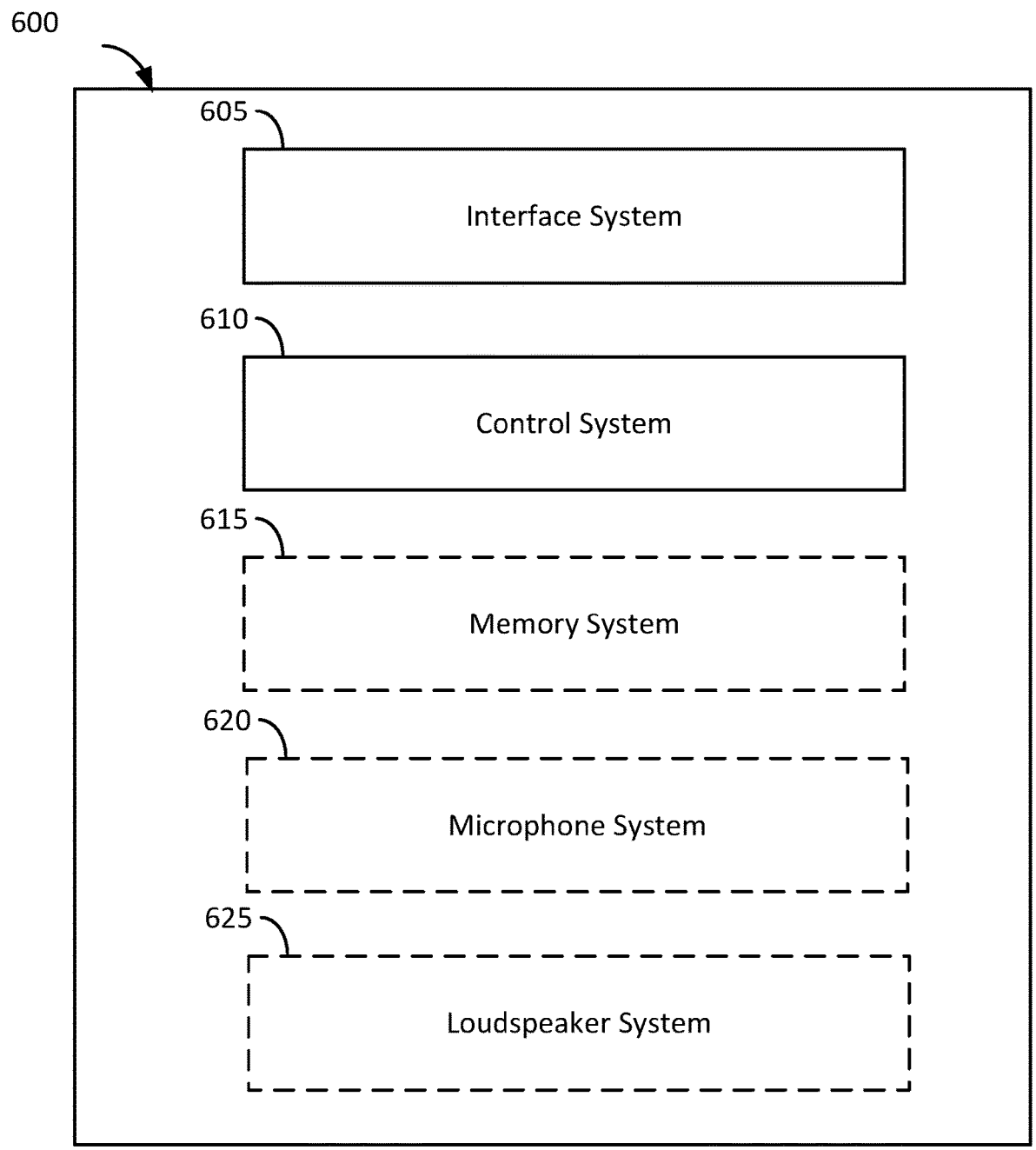
FIG. 6 shows a block diagram that illustrates examples of components of an apparatus capable of implementing various aspects of this disclosure.

FIG. 6 is a block diagram that shows examples of components of an apparatus capable of implementing various aspects of this disclosure. As with other figures provided herein, the types and numbers of elements shown in FIG. 6 are merely provided by way of example. Other implementations may include more, fewer and/or different types and numbers of elements. According to some examples, the apparatus 600 may be configured for performing at least some of the methods disclosed herein. In some implementations, the apparatus 600 may be, or may include, a television, one or more components of an audio system, a mobile device (such as a cellular telephone), a laptop computer, a tablet device, a smart speaker, or another type of device.

According to some alternative implementations the apparatus 600 may be, or may include, a server. In some such examples, the apparatus 600 may be, or may include, an encoder. Accordingly, in some instances the apparatus 600 may be a device that is configured for use within an audio environment, such as a home audio environment, whereas in other instances the apparatus 600 may be a device that is configured for use in "the cloud," e.g., a server.

In this example, the apparatus 600 includes an interface system 605 and a control system 610. The interface system 605 may, in some implementations, be configured for communication with one or more other devices of an audio environment. The audio environment may, in some examples, be a home audio environment. In other examples, the audio environment may be another type of environment, such as an office environment, an automobile environment, a train environment, a street or sidewalk environment, a park environment, etc. The interface system 605 may, in some implementations, be configured for exchanging control information and associated data with audio devices of the audio environment. The control information and associated data may, in some examples, pertain to one or more software applications that the apparatus 600 is executing.

The interface system 605 may, in some implementations, be configured for receiving, or for providing, a content stream. The content stream may include audio data. The audio data may include, but may not be limited to, audio signals. In some instances, the audio data may include spatial data, such as channel data and/or spatial metadata. In some examples, the content stream may include video data and audio data corresponding to the video data.

The interface system 605 may include one or more network interfaces and/or one or more external device interfaces (such as one or more universal serial bus (USB) interfaces). According to some implementations, the interface system 605 may include one or more wireless interfaces. The interface system 605 may include one or more devices for implementing a user interface, such as one or more microphones, one or more speakers, a display system, a touch sensor system and/or a gesture sensor system. In some examples, the interface system 605 may include one or more interfaces between the control system 610 and a memory system, such as the optional memory system 615 shown in FIG. 6. However, the control system 610 may include a memory system in some instances. The interface system 605 may, in some implementations, be configured for receiving input from one or more microphones in an environment.

The control system 610 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In some implementations, the control system 610 may reside in more than one device. For example, in some implementations a portion of the control system 610 may reside in a device within one of the environments depicted herein and another portion of the control system 610 may reside in a device that is outside the environment, such as a server, a mobile device (e.g., a smartphone or a tablet computer), etc. In other examples, a portion of the control system 610 may reside in a device within one environment and another portion of the control system 610 may reside in one or more other devices of the environment. For example, a portion of the control system 610 may reside in a device that is implementing a cloud-based service, such as a server, and another portion of the control system 610 may reside in another device that is implementing the cloud-based service, such as another server, a memory device, etc. The interface system 605 also may, in some examples, reside in more than one device.

In some implementations, the control system 610 may be configured for performing, at least in part, the methods disclosed herein. According to some examples, the control system 610 may be configured for implementing methods of determining numbers of source blocks and/or parity blocks for a particular wireless communication protocol, generating one or more parity blocks, transmitting and/or receiving packets, reconstructing corrupted source blocks, causing reconstructed audio frames to be presented, or the like.

Some or all of the methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. The one or more non-transitory media may, for example, reside in the optional memory system 615 shown in FIG. 6 and/or in the control system 610. Accordingly, various innovative aspects of the subject matter described in this disclosure can be implemented in one or more non-transitory media having software stored thereon. The software may, for example, include instructions for determining numbers of source blocks and/or parity blocks for a particular wireless communication protocol, generating one or more parity blocks, transmitting and/or receiving packets, reconstructing corrupted source blocks, causing reconstructed audio frames to be presented, etc. The software may, for example, be executable by one or more components of a control system such as the control system 610 of FIG. 6.

In some examples, the apparatus 600 may include the optional microphone system 620 shown in FIG. 6. The optional microphone system 620 may include one or more microphones. In some implementations, one or more of the microphones may be part of, or associated with, another device, such as a speaker of the speaker system, a smart audio device, etc. In some examples, the apparatus 600 may not include a microphone system 620. However, in some such implementations the apparatus 600 may nonetheless be configured to receive microphone data for one or more microphones in an audio environment via the interface system 610. In some such implementations, a cloud-based implementation of the apparatus 600 may be configured to receive microphone data, or a noise metric corresponding at least in part to the microphone data, from one or more microphones in an audio environment via the interface system 610.

According to some implementations, the apparatus 600 may include the optional loudspeaker system 625 shown in FIG. 6. The optional loudspeaker system 625 may include one or more loudspeakers, which also may be referred to herein as "speakers" or, more generally, as "audio reproduction transducers." In some examples (e.g., cloud-based implementations), the apparatus 600 may not include a loudspeaker system 625. In some implementations, the apparatus 600 may include headphones. Headphones may be connected or coupled to the apparatus 600 via a headphone jack or via a wireless connection (e.g., BLUETOOTH).

Some aspects of present disclosure include a system or device configured (e.g., programmed) to perform one or more examples of the disclosed methods, and a tangible computer readable medium (e.g., a disc) which stores code for implementing one or more examples of the disclosed methods or steps thereof. For example, some disclosed systems can be or include a programmable general purpose processor, digital signal processor, or microprocessor, programmed with software or firmware and/or otherwise configured to perform any of a variety of operations on data, including an embodiment of disclosed methods or steps thereof. Such a general purpose processor may be or include a computer system including an input device, a memory, and a processing subsystem that is programmed (and/or otherwise configured) to perform one or more examples of the disclosed methods (or steps thereof) in response to data asserted thereto.

Some embodiments may be implemented as a configurable (e.g., programmable) digital signal processor (DSP) that is configured (e.g., programmed and otherwise configured) to perform required processing on audio signal(s), including performance of one or more examples of the disclosed methods. Alternatively, embodiments of the disclosed systems (or elements thereof) may be implemented as a general purpose processor (e.g., a personal computer (PC) or other computer system or microprocessor, which may include an input device and a memory) which is programmed with software or firmware and/or otherwise configured to perform any of a variety of operations including one or more examples of the disclosed methods. Alternatively, elements of some embodiments of the inventive system are implemented as a general purpose processor or DSP configured (e.g., programmed) to perform one or more examples of the disclosed methods, and the system also includes other elements (e.g., one or more loudspeakers and/or one or more microphones). A general purpose processor configured to perform one or more examples of the disclosed methods may be coupled to an input device (e.g., a mouse and/or a key board), a memory, and a display device.

Another aspect of present disclosure is a computer readable medium (for example, a disc or other tangible storage medium) which stores code for performing (e.g., coder executable to perform) one or more examples of the disclosed methods or steps thereof.

While specific embodiments of the present disclosure and applications of the disclosure have been described herein, it will be apparent to those of ordinary skill in the art that many variations on the embodiments and applications described herein are possible without departing from the scope of the disclosure described and claimed herein. It should be understood that while certain forms of the disclosure have been shown and described, the disclosure is not to be limited to the specific embodiments described and shown or the specific methods described.

The invention claimed is:

1. A method for transmitting an audio stream, comprising:
   obtaining a frame of an audio signal;
   determining a number of source blocks to divide the frame of the audio signal into and a number of parity blocks to generate for forward error correction, wherein the number of source blocks and the number of parity blocks are determined based at least in part on characteristics of a wireless communication protocol to be used to transmit the audio stream;
   dividing the frame of the audio signal into the number of source blocks;
   generating the number of parity blocks using the source blocks; and
   transmitting the source blocks and the parity blocks, wherein the parity blocks are usable by a decoder to reconstruct one or more corrupted or missing source blocks.

2. The method of claim 1, wherein the parity blocks are generated using a Reed-Solomon encoder.

3. The method of claim 1, wherein the characteristics of the wireless communication protocol comprise timing information indicating packet scheduling of the wireless communication protocol.

4. The method of claim 3, wherein the number of parity blocks is determined by:
   determining a total number of blocks to be used to encode the frame of the audio signal based on a duration of the frame of the audio signal and the timing information indicating packet scheduling;
   determining the number of source blocks; and
   determining the number of parity blocks by determining a difference between the total number of blocks and the number of source blocks.

5. The method of claim 1, wherein the characteristics of the wireless communication protocol comprise a frame size of the frame of the audio signal and/or a packet size of a packet to be used to transmit a source block of the source blocks or a parity block of the parity blocks.

6. The method of claim 5, wherein the number of source blocks to be used is determined by determining a number of packets each having the packet size to transmit the frame having the frame size.

7. The method of claim 1, wherein the number of parity blocks identified for the frame of the audio signal differs from a number of parity blocks generated for a preceding frame of the audio signal.

8. The method of claim 1, wherein the number of parity blocks generated for frames of the audio signal varies in a repeatable manner that is determined based on timing information indicating packet scheduling of the wireless communication protocol.

9. The method of claim 1, wherein frames of the audio signal are not re-transmitted responsive to portions of the frames being dropped or corrupted.

10. The method of claim 1, wherein the wireless communication protocol is a BLUETOOTH protocol.

11. A method for receiving an audio stream, comprising:
receiving a set of source blocks and a set of parity blocks corresponding to a frame of an audio signal using a wireless communication protocol, wherein the set of source blocks are at least a subset of source blocks generated by an encoder and the set of parity blocks are at least a subset of parity blocks generated by the encoder, and wherein a number of source blocks and a number of parity blocks generated and transmitted by the encoder were determined based at least in part on characteristics of the wireless communication protocol;
determining a number of corrupted source blocks of the set of source blocks;
responsive to determining that the number of corrupted source blocks is greater than zero, determining whether to reconstruct the corrupted source blocks;
responsive to determining the corrupted source blocks are to be reconstructed, reconstructing the corrupted source blocks; and
causing a version of the audio frame comprising the reconstructed corrupted source blocks to be presented.

12. The method of claim 11, wherein determining whether to reconstruct the corrupted source blocks comprises determining whether the number of corrupted source blocks is less than a number of non-corrupted parity blocks in the set of parity blocks received.

13. The method of claim 11, further comprising:
receiving a second set of source blocks and a second set of parity blocks corresponding to a second frame of the audio signal;
determining a second number of corrupted source blocks of the second set of source blocks;
responsive to determining that the second number of corrupted source blocks of the second set of source blocks is greater than the number of parity blocks in the second set of parity blocks, generating a replacement audio frame; and
causing the replacement audio frame to be presented.

14. The method of claim 13, wherein the replacement audio frame comprises a reduction in output level of the audio signal.

15. The method of claim 11, wherein reconstructing the corrupted source blocks comprises providing the set of source blocks and the set of parity blocks to a Reed-Solomon decoder.

16. The method of claim 11, further comprising storing the set of source blocks and the set of parity blocks in a buffer prior to reconstructing the corrupted source blocks, and wherein an amount of audio data stored in the buffer varies over time based at least in part on packet scheduling associated with the wireless communication protocol.

17. The method of claim 11, wherein the wireless communication protocol is a BLUETOOTH protocol.

18. The method of claim 11, wherein the version of the audio frame comprising the reconstructed corrupted source blocks is presented via a loudspeaker.

19. An apparatus configured for implementing the method of claim 1.

20. One or more non-transitory media having software stored thereon, the software including instructions for controlling one or more devices to perform the method of claim 1.

* * * * *